(12) United States Patent
Sugiura et al.

(10) Patent No.: US 9,231,196 B2
(45) Date of Patent: Jan. 5, 2016

(54) MAGNETORESISTIVE ELEMENT AND METHOD OF MANUFACTURING THE SAME

(71) Applicants: Kuniaki Sugiura, Seoul (KR); Tadashi Kai, Seoul (KR)

(72) Inventors: Kuniaki Sugiura, Seoul (KR); Tadashi Kai, Seoul (KR)

( * ) Notice: Subject to any disclaimer, the term of this patent is extended or adjusted under 35 U.S.C. 154(b) by 0 days.

(21) Appl. No.: 14/200,670

(22) Filed: Mar. 7, 2014

(65) Prior Publication Data
US 2015/0069550 A1 Mar. 12, 2015

Related U.S. Application Data

(60) Provisional application No. 61/876,081, filed on Sep. 10, 2013.

(51) Int. Cl.
*H01L 43/02* (2006.01)
*H01L 43/12* (2006.01)
*H01L 43/08* (2006.01)

(52) U.S. Cl.
CPC ............... *H01L 43/12* (2013.01); *H01L 43/08* (2013.01)

(58) Field of Classification Search
CPC .............................. H01L 27/228; H01L 43/08
See application file for complete search history.

(56) References Cited

U.S. PATENT DOCUMENTS

| | | | |
|---|---|---|---|
| 6,165,803 A | 12/2000 | Chen et al. | |
| 6,297,983 B1 | 10/2001 | Bhattacharyya | |
| 6,365,286 B1 | 4/2002 | Inomata et al. | |
| 6,391,430 B1 | 5/2002 | Fullerton et al. | |
| 6,479,353 B2 | 11/2002 | Bhattacharyya | |
| 6,483,675 B1 | 11/2002 | Araki et al. | |
| 6,713,830 B2 | 3/2004 | Nishimura et al. | |
| 6,829,121 B2 | 12/2004 | Ikeda et al. | |
| 6,895,658 B2 | 5/2005 | Shimazawa et al. | |
| 6,965,138 B2 | 11/2005 | Nakajima et al. | |
| 6,987,652 B2 | 1/2006 | Koganei | |
| 7,220,601 B2 | 5/2007 | Hwang et al. | |
| 7,586,781 B2 | 9/2009 | Saitoh et al. | |
| 7,619,431 B2 | 11/2009 | De Wilde et al. | |
| 7,746,603 B2 | 6/2010 | Gill et al. | |
| 7,768,824 B2 | 8/2010 | Yoshikawa et al. | |

(Continued)

FOREIGN PATENT DOCUMENTS

| | | | |
|---|---|---|---|
| JP | 04241481 A | 8/1992 | |
| JP | 09041138 A | 2/1997 | |

(Continued)

OTHER PUBLICATIONS

Related U.S. Appl. No. 13/226,868; First Named Inventor: Yuichi Ohsawa; Title: "Method of Manufacturing Magnetic Memory"; Filed: Sep. 7, 2011.

(Continued)

*Primary Examiner* — Mark Prenty
(74) *Attorney, Agent, or Firm* — Holtz, Holtz, Goodman & Chick PC

(57) ABSTRACT

According to one embodiment, a magnetoresistive element is disclosed. The element includes a lower electrode, a stacked body provided on the lower electrode and including a first magnetic layer, a tunnel barrier layer and a second magnetic layer. The first magnetic layer is under the tunnel barrier layer, the second magnetic layer is on the tunnel barrier layer. The first magnetic layer includes a first region and a second region outside the first region to surround the first region. The second region includes an element in the first region and other element being different from the element.

7 Claims, 5 Drawing Sheets

(56) References Cited

U.S. PATENT DOCUMENTS

| | | |
|---|---|---|
| 7,916,430 B2 | 3/2011 | Kagami et al. |
| 7,957,184 B2 | 6/2011 | Yoshikawa et al. |
| 8,119,018 B2 | 2/2012 | Ikemoto et al. |
| 8,130,474 B2 | 3/2012 | Childress et al. |
| 8,139,405 B2 | 3/2012 | Yoshikawa et al. |
| 8,154,915 B2 | 4/2012 | Yoshikawa et al. |
| 8,218,355 B2 | 7/2012 | Kitagawa et al. |
| 8,223,533 B2 | 7/2012 | Ozeki et al. |
| 8,268,713 B2 | 9/2012 | Yamagishi et al. |
| 8,270,125 B2 | 9/2012 | Gill |
| 8,339,841 B2 | 12/2012 | Iwayama et al. |
| 8,475,672 B2 | 7/2013 | Iori et al. |
| 8,710,605 B2 | 4/2014 | Takahashi et al. |
| 8,716,034 B2 | 5/2014 | Ohsawa et al. |
| 8,928,055 B2 | 1/2015 | Saida et al. |
| 8,963,264 B2 | 2/2015 | Dimitrov et al. |
| 2001/0022742 A1 | 9/2001 | Bhattacharyya |
| 2001/0024347 A1 | 9/2001 | Shimazawa et al. |
| 2002/0070361 A1 | 6/2002 | Mack et al. |
| 2002/0146851 A1 | 10/2002 | Okazawa et al. |
| 2002/0167059 A1 | 11/2002 | Nishimura et al. |
| 2002/0182442 A1 | 12/2002 | Ikeda et al. |
| 2003/0067800 A1 | 4/2003 | Koganei |
| 2004/0080876 A1 | 4/2004 | Sugita et al. |
| 2004/0188732 A1 | 9/2004 | Fukuzumi |
| 2005/0020076 A1 | 1/2005 | Lee et al. |
| 2005/0048675 A1 | 3/2005 | Ikeda |
| 2005/0174876 A1 | 8/2005 | Katoh |
| 2005/0254289 A1 | 11/2005 | Nakajima et al. |
| 2005/0274997 A1 | 12/2005 | Gaidis et al. |
| 2006/0043317 A1 | 3/2006 | Ono et al. |
| 2006/0105570 A1 | 5/2006 | Hautala et al. |
| 2007/0164338 A1 | 7/2007 | Hwang et al. |
| 2008/0122005 A1 | 5/2008 | Horsky et al. |
| 2009/0080238 A1 | 3/2009 | Yoshikawa et al. |
| 2009/0191696 A1 | 7/2009 | Shao et al. |
| 2009/0243008 A1 | 10/2009 | Kitagawa et al. |
| 2009/0285013 A1 | 11/2009 | Saitoh et al. |
| 2010/0097846 A1 | 4/2010 | Sugiura et al. |
| 2010/0135068 A1 | 6/2010 | Ikarashi et al. |
| 2010/0183902 A1 | 7/2010 | Kim et al. |
| 2010/0230770 A1 | 9/2010 | Yoshikawa et al. |
| 2011/0037108 A1 | 2/2011 | Sugiura et al. |
| 2011/0059557 A1 | 3/2011 | Yamagishi et al. |
| 2011/0159316 A1 | 6/2011 | Wang et al. |
| 2011/0174770 A1 | 7/2011 | Hautala |
| 2011/0211389 A1 | 9/2011 | Yoshikawa et al. |
| 2011/0222335 A1 | 9/2011 | Yoshikawa et al. |
| 2011/0233697 A1 | 9/2011 | Kajiyama |
| 2012/0032288 A1 | 2/2012 | Tomioka |
| 2012/0056253 A1 | 3/2012 | Iwayama et al. |
| 2012/0074511 A1 | 3/2012 | Takahashi et al. |
| 2012/0135543 A1 | 5/2012 | Shin et al. |
| 2012/0139019 A1 | 6/2012 | Iba |
| 2012/0244639 A1 | 9/2012 | Ohsawa et al. |
| 2012/0244640 A1 | 9/2012 | Ohsawa et al. |
| 2013/0017626 A1 | 1/2013 | Tomioka |
| 2013/0069186 A1 | 3/2013 | Toko et al. |
| 2013/0099338 A1 | 4/2013 | Nakayama et al. |
| 2013/0181305 A1 | 7/2013 | Nakayama et al. |
| 2014/0327096 A1 | 11/2014 | Guo |
| 2014/0356979 A1 | 12/2014 | Annunziata et al. |
| 2015/0069542 A1 | 3/2015 | Nagamine et al. |

FOREIGN PATENT DOCUMENTS

| | | |
|---|---|---|
| JP | 2000156531 A | 6/2000 |
| JP | 2001052316 A | 2/2001 |
| JP | 2001308292 A | 11/2001 |
| JP | 2002176211 A | 6/2002 |
| JP | 2002280640 A | 9/2002 |
| JP | 2002299726 A | 10/2002 |
| JP | 2002299727 A | 10/2002 |
| JP | 2002305290 A | 10/2002 |
| JP | 2003110162 A | 4/2003 |
| JP | 2003536199 A | 12/2003 |
| JP | 2004006589 A | 1/2004 |
| JP | 2004500483 A | 1/2004 |
| JP | 2005209951 A | 8/2005 |
| JP | 2006005342 A | 1/2006 |
| JP | 2006510196 A | 3/2006 |
| JP | 2006165031 A | 6/2006 |
| JP | 2007053315 A | 3/2007 |
| JP | 2007234897 A | 9/2007 |
| JP | 2007305610 A | 11/2007 |
| JP | 2008066612 A | 3/2008 |
| JP | 2008522429 A | 6/2008 |
| JP | 2008153527 A | 7/2008 |
| JP | 2008171882 A | 7/2008 |
| JP | 2008193103 A | 8/2008 |
| JP | 2008-282940 A | 11/2008 |
| JP | 2009054715 A | 3/2009 |
| JP | 2009081216 A | 4/2009 |
| JP | 2009239120 A | 10/2009 |
| JP | 2010003342 A | 1/2010 |
| JP | 2010113782 A | 5/2010 |
| JP | 2011040580 A | 2/2011 |
| JP | 2011054873 A | 3/2011 |
| JP | 2012-244051 A | 12/2012 |
| JP | 2013153232 A | 8/2013 |
| WO | 2005088745 A1 | 9/2005 |

OTHER PUBLICATIONS

Related U.S. Appl. No. 13/226,960; First Named Inventor: Yuichi Ohsawa; Title: "Method of Manufacturing Multilayer Film"; Filed: Sep. 7, 2011.

Related U.S. Appl. No. 13/604,537; First Named Inventor: Masahiko Nakayama; Title: "Magnetic Memory Element and Magnetic Memory"; Filed: Sep. 5, 2012.

Albert, et al., "Spin-polarized current switching of a Co thin film nanomagnet", Applied Physics Letters, vol. 77, No. 23, Oct. 7, 2000, 3809-3811.

Otani, et al., "Microfabrication of Magnetic Tunnel Junctions Using CH3OH Etching", IEEE Transactions on Magnetics, vol. 43, No. 6, Jun. 6, 2007, 2776-2778.

U.S. Appl. No. 13/231,894; First Named Inventor: Shigeki Takahashi; Title: "Magnetic Memory and Method of Manufacturing the Same"; Filed: Sep. 13, 2011.

U.S. Appl. No. 14/202,802; First Named Inventor: Masahiko Nakayama; Title: "Magnetoresistive Element and Method of Manufacturing the Same"; Filed: Mar. 10, 2014.

U.S. Appl. No. 14/203,249; First Named Inventor: Masahiko Nakayama; Title: "Magnetic Memory and Method of Manufacturing the Same"; Filed: Mar. 10, 2014.

U.S. Appl. No. 14/200,742; First Named Inventor: Masaru Toko; Title: "Magnetoresistive Element and Method for Manufacturing the Same"; Filed: Mar. 7, 2014.

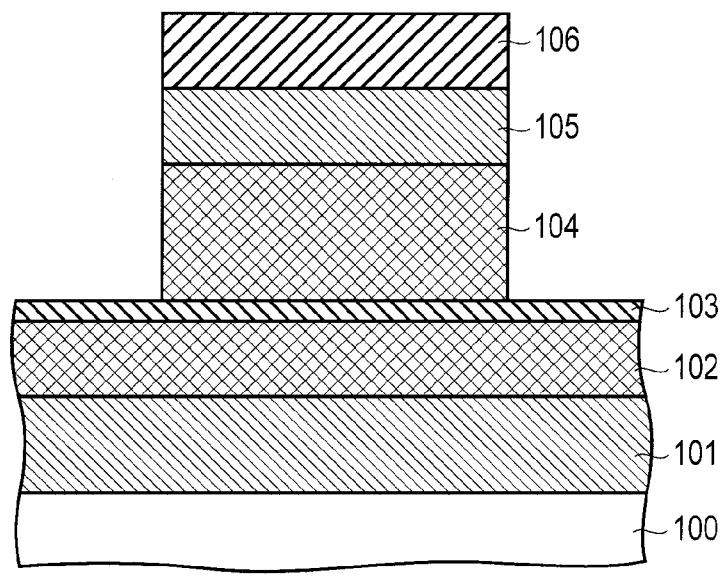
F I G. 3
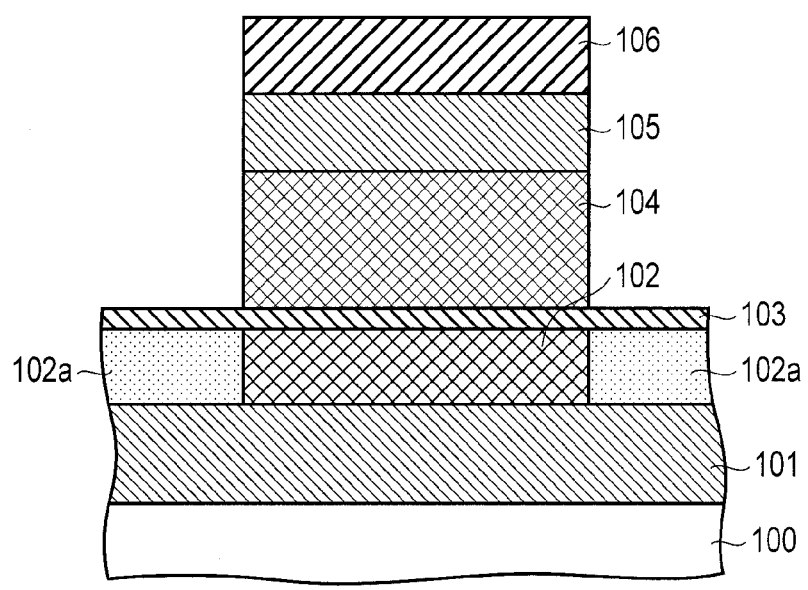
F I G. 4

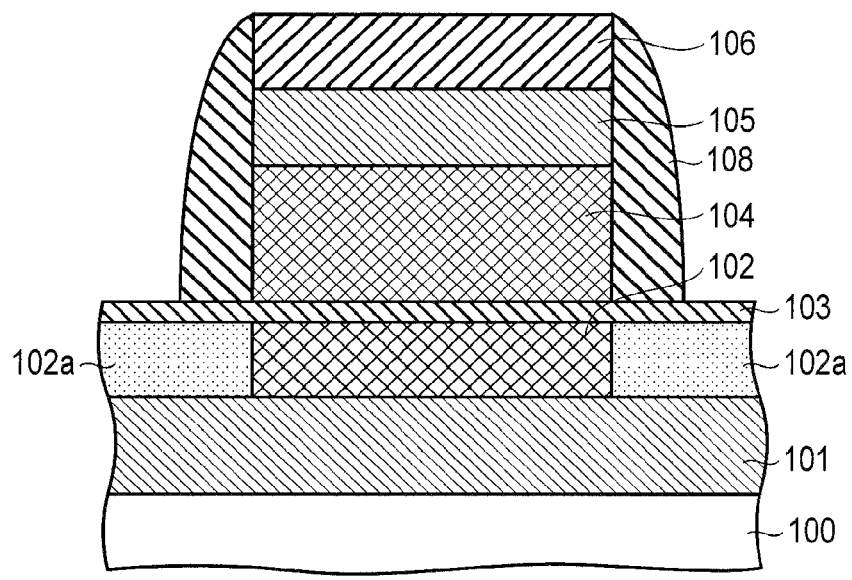
F I G. 5
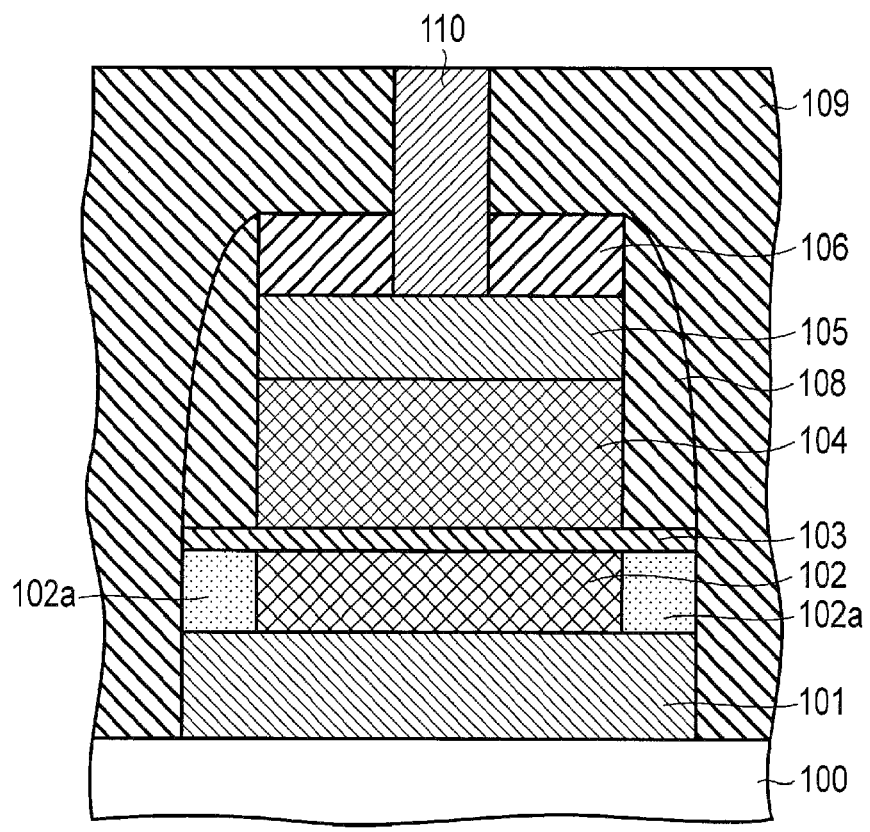
F I G. 6

MAGNETORESISTIVE ELEMENT AND METHOD OF MANUFACTURING THE SAME

CROSS-REFERENCE TO RELATED APPLICATIONS

This application claims the benefit of U.S. Provisional Application No. 61/876,081, filed Sep. 10, 2013, the entire contents of which are incorporated herein by reference.

FIELD

Embodiments described herein relate generally to a magnetoresistive element and a method of manufacturing the same.

BACKGROUND

In recent years, a semiconductor memory utilizing a resistance variable element as a memory element, such as a PRAM (phase-change random access memory) or an MRAM (magnetic random access memory), has been attracting attention and being developed. The MRAM is a device which performs a memory operation by storing "1" or "0" information in a memory cell by using a magnetoresistive effect, and has features of nonvolatility, high-speed operation, high integration and high reliability.

One of magnetoresistive effect elements is a magnetic tunnel junction (MTJ) element including a three-layer multilayer structure of a storage layer having a variable magnetization direction, an insulation film as a tunnel barrier, and a reference layer which maintains a predetermined magnetization direction.

The resistance of the MTJ element varies depending on the magnetization directions of the storage layer and the reference layer, it takes a minimum value when the magnetization directions are parallel, and takes a maximum value when the magnetization directions are antiparallel, and information is stored by associating the parallel state and antiparallel state with binary information "0" and binary information "1", respectively.

The writing of information into the MTJ element involves a magnetic-field write scheme in which only the magnetization direction in the storage layer is reversed by a current magnetic field that is generated when a current flowing is flowed through a write line, and a write (spin injection write) scheme using spin angular momentum movement in which the magnetization direction in the storage layer is reversed by passing a spin polarization current through the MTJ element itself.

In the former scheme, when the element size is reduced, the coercivity of a magnetic body constituting the storage layer increases and the write current tends to increase, and thus it is difficult to achieve both the miniaturization and low electric current.

On the other hand, in the latter scheme (spin injection write scheme), spin polarized electron to be injected into the MTJ element decreases with the decrease of the volume of the magnetic layer constituting the storage layer, so that it is expected that both the miniaturization and low electric current may be easily achieved.

BRIEF DESCRIPTION OF THE DRAWINGS

FIG. 3 is a sectional view for explaining the manufacturing method of the magnetic memory according to the first embodiment following FIG. 2.

FIG. 4 is a sectional view for explaining the manufacturing method of the magnetic memory according to the first embodiment following FIG. 3.

FIG. 5 is a sectional view for explaining the manufacturing method according to the first embodiment following FIG. 4.

FIG. 6 is a sectional view for explaining the manufacturing method according to the first embodiment following FIG. 5.

DETAILED DESCRIPTION

Figure 1:
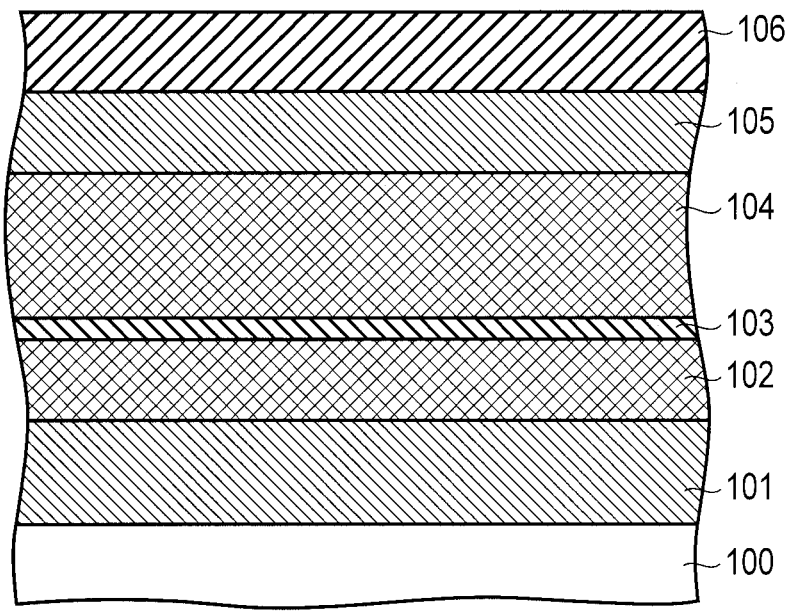
FIG. 1 is a sectional view for explaining a manufacturing method of a magnetic memory according to a first embodiment.
Figure 2:
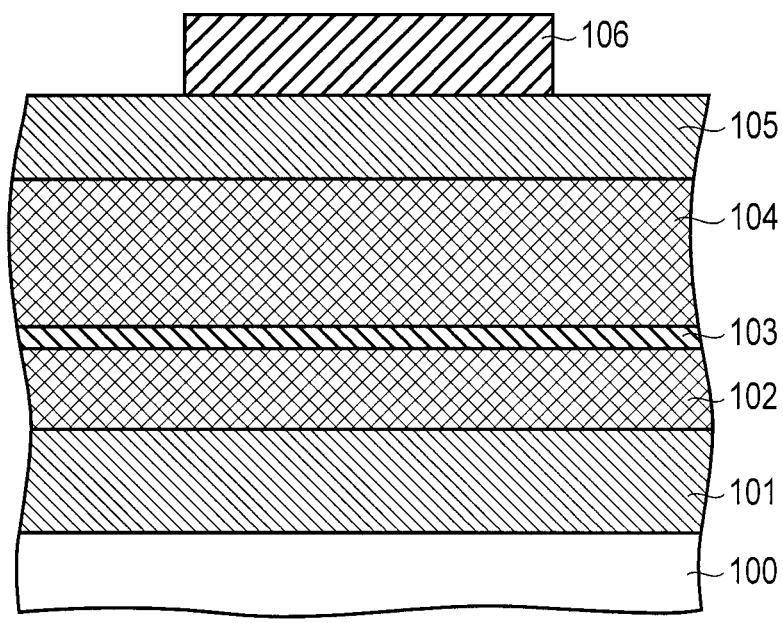
FIG. 2 is a sectional view for explaining the manufacturing method of the magnetic memory according to the first embodiment following FIG. 1.

Embodiments will be hereinafter described with reference to the accompanying drawings. In the following drawings, portions corresponding to already-shown drawings will be denoted by the same signs (including a sign having a different subscript), and their detailed explanations will be omitted.

In general, according to one embodiment, a magnetoresistive element is disclosed. The magnetoresistive element includes a lower electrode; a stacked body provided on the lower electrode and including a first magnetic layer, a tunnel barrier layer and a second magnetic layer. The first magnetic layer includes a first region and a second region provided outside the first region to surround the first region. The second region includes an element included in the first region and other element being different from the element. A hard mask layer is provided on the stacked body. A cap layer is provided on the hard mask layer. The magnetoresistive element further includes an upper electrode penetrating the cap layer and contacting the hard mask.

According to an embodiment, a method for manufacturing a magnetoresistive element is disclosed. A stacked body is formed on a substrate. The stacked body includes a first magnetic layer, a tunnel barrier layer and a second magnetic layer. A hard mask layer is formed on the stacked body. A cap layer is formed on the hard mask layer. The cap layer is processed. The stacked body and the hard mask are etched using the processed cap layer as a mask. Ions are implanted into a portion of the stacked body that is outside of the cap layer using the cap layer as a mask.

First Embodiment

FIGS. 1 to 6 are sectional views for explaining a method of manufacturing a magnetic memory according to a first embodiment. In the present embodiment, a case where the magnetic memory is a magnetic random access memory (MRAM) will be described.

[FIG. 1]

A lower electrode 101, a storage layer 102, a tunnel barrier layer 103, a reference layer 104, a hard mask 105 having conductivity and a cap layer 106 having insulating properties are successively formed on a substrate 100.

The substrate 100 comprises a silicon substrate (semiconductor substrate), a selection transistor formed on a surface of the silicon substrate and configured to select an MTJ element, an interlayer insulating film, etc. The storage layer 102 comprises, for example, CoFeB. The tunnel barrier layer 103 comprises, for example, magnesium oxide (MgO). The reference layer 102 comprises, for example, an alloy of Pt (precious metal) and Ni or Co (magnetic material). The hard mask 105 comprises, for example, W, Ta or Ru. The cap layer 106 comprises, for example, silicon nitride.

[FIG. 2]

The cap layer 106 is processed into a predetermined shape by etching the cap layer 106 using a resist pattern which is formed on the cap layer 106 and not shown as a mask.

[FIG. 3]

The resist pattern and the cap layer 106 are used as a mask, and the hard mask 105 and the reference layer 104 are etched by RIE process. The RIE process is performed under the condition that it stops on the tunnel barrier layer 103. The resist pattern disappears during the RIE process, and then the cap layer 106 functions as a mask of the etching.

Damage is caused on the storage layer 102 outside the cap layer 106 by the RIE process. The damage caused on the storage layer 102 may deteriorate magnetic anisotropy, spin injection efficiency and an MR ratio. Therefore, the damage may degrade the properties of the MTJ element.

It should be noted that the etching may be performed not only in RIE process but in IBE process.

[FIG. 4]

In the present embodiment, ions 107 are implanted into the storage layer 102 using the cap layer 106 as a mask to reduce an influence of the damage of the storage layer 102. In the figure, 102a denotes a storage layer of a portion into which the ions 107 are implanted (second region). The storage layer 102a includes, for example, CoFeB (magnetic material) and the ions 107 (element). The storage layer 102 (first region) under the cap layer 106 does not include the ions 107 (element).

The ions 107 are implanted also into the tunnel barrier layer 103 and the cap layer 106 on the storage layer 102a. The ions 107 may be implanted also into the lower electrode 101.

The thickness of the cap layer 106 is selected in such a manner that the ions 107 are not to be implanted into the hard mask 105 when the ions are implanted into the tunnel barrier layer 103 and the storage layer 102a. For example, the thickness of the cap layer 106 is greater than the sum of the thickness of the tunnel barrier layer 103 and the thickness of the storage layer 102a. Thus, a problem that the ions 107 are implanted into the hard mask 105 and resistance of the hard mask 105 increases does not occur.

The reason why the influence of the damage of the storage layer 102 is reduced is that the storage layer 102a is demagnetized by ion implantation of the ions 107. By the implantation of the ions 107, the storage layer 102a is not only electrically deactivated, but it may be magnetically deactivated.

An element used as the ions 107 is, for example, at least one of As, Ge, Ga, Sb, In, N, Ar, He, F, Cl, Br, I, O, Si, B, C, Zr, Tb and Ti. Among them, especially, As and Ge are effective in reducing the influence of the damage of the storage layer 102, since they have a large atomic radiuses. As and Ge may reduce a dose amount of the ion implantation.

[FIG. 5]

An insulating layer is formed on an entire surface to cover the stacked body of the reference layer 104, the hard mask 105 and the cap layer 106, thereafter, a sidewall 108 comprising the insulating layer is formed on the side wall of the stacked body of the reference layer 104, the hard mask 105 and the cap layer 106 by etching the entire surface of the insulating layer

[FIG. 6]

The tunnel barrier layer 103, the storage layer 102a and the lower electrode 101 are processed by etching using the sidewall 108 as a mask.

An insulating layer 109 is formed on an entire surface to cover the cap layer 106 and the sidewall 108, thereafter, an opening reaching the hard mask 105 is formed in the insulating layer 109 and the cap layer 106, and the upper electrode 110 is formed in this opening.

Since the ions 107 are not implanted into the hard mask 105 in the step of FIG. 4, increase of contact resistance between the hard mask 105 and the upper electrode 110 is suppressed.

A process for forming the upper electrode 110 includes, for example, depositing conducting layer to be processed into the upper electrode 110 to fill in the opening, and then planarizing surfaces of the conducting layer and the insulating layer 109 by chemical mechanical polishing (CMP). As a result, the upper electrode 110 penetrating the cap layer 106 and contacting the hard mask 105 is obtained.

Second Embodiment

Figure 7:
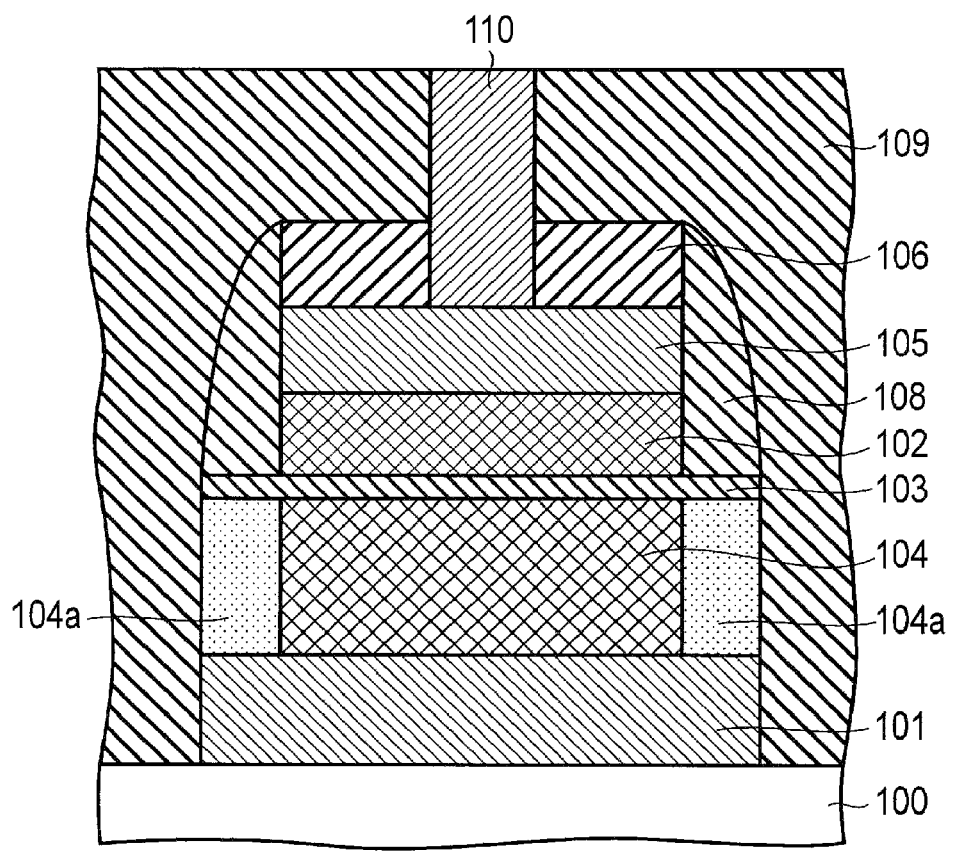
FIG. 7 is a sectional view indicating an MRAM according to a second embodiment.

FIG. 7 is a sectional view for explaining an MRAM according to a second embodiment. The present embodiment is different from the first embodiment in a positional relationship between a storage layer 102 and a reference layer 104, i.e., in that the storage layer 102 is arranged higher than the reference layer 104.

The MRAM according to the present embodiment can be obtained in accordance with the manufacturing method according to the first embodiment, and has an advantage similar to that of the first embodiment. In FIG. 7, 104a denotes a reference layer of a demagnetized portion into which ions 107 are implanted (fourth region). The reference layer 104a includes a magnetic material and the ions 107 (element). The reference layer 104 (third region) under a cap layer 106 does not include the ions 107 (element).

Third Embodiment

Figure 8:
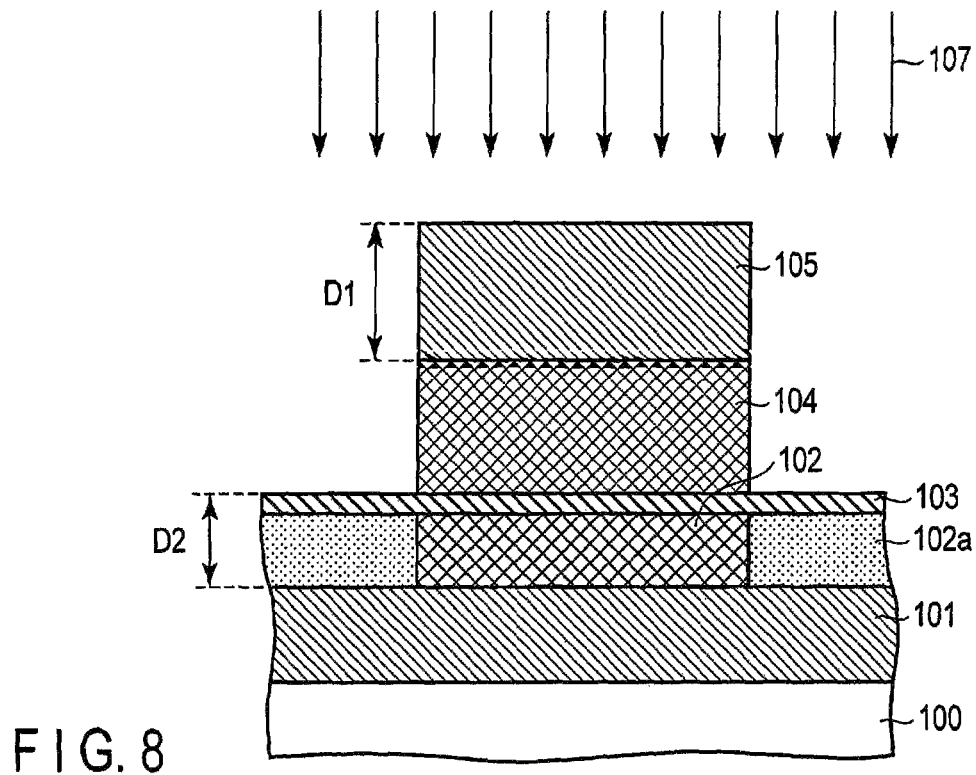
FIG. 8 is a sectional view for explaining a manufacturing method of a magnetic memory according to a third embodiment.
Figure 9:
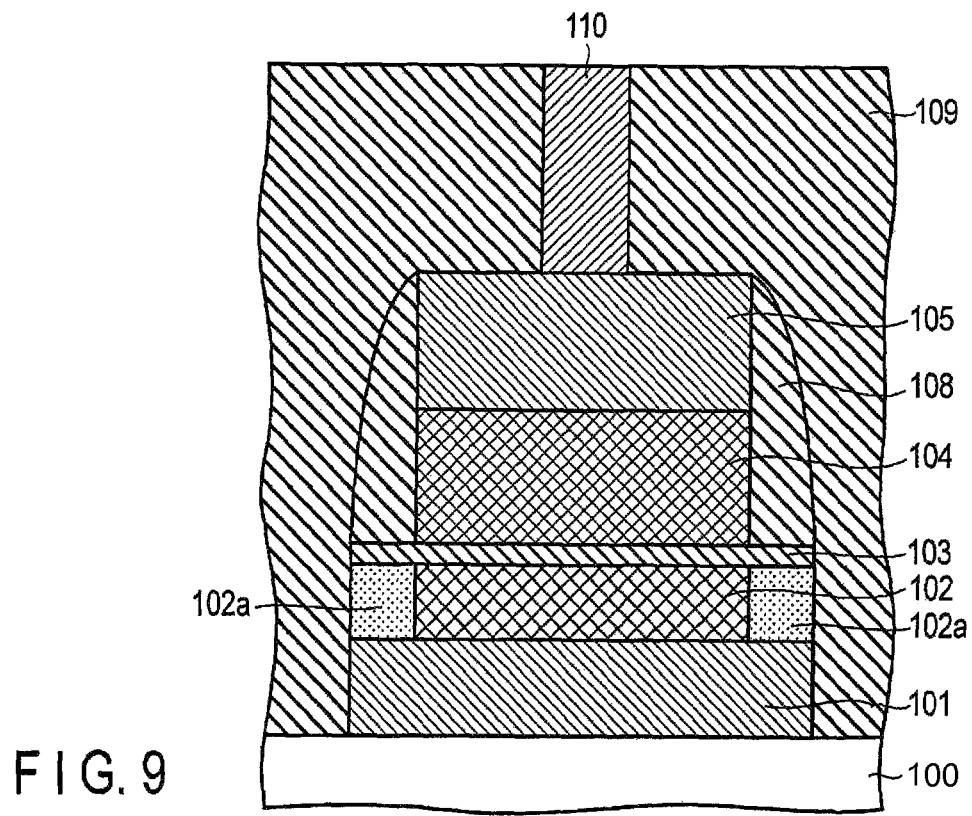
FIG. 9 is a sectional view for explaining the manufacturing method of the magnetic memory according to the third embodiment following FIG. 8.

FIGS. 8 and 9 are sectional views for explaining a method of manufacturing an MRAM according to a third embodiment. In the present embodiment, a cap layer 106 is not formed.

A step of FIG. 8 corresponds to the step of FIG. 4 in the first embodiment (ion implantation).

In the present embodiment, the thickness of the hard mask 105 (D1) is set to be greater than the sum (D2) of the thickness of the tunnel barrier layer 103 and the thickness of the storage layer 102 (D1>D2).

Thus, if ions 107 are implanted into the tunnel barrier layer 103 and the storage layer 102 under the condition that the ions 107 are not implanted into a lower electrode 101, a reference layer 104 is not damaged by the ions 107, since the ions 107 implanted into the hard mask 105 do not reach the reference layer 104.

Thereafter, the MRAM having a structure in which the upper electrode 110 shown in FIG. 9 contacts the hard mask 105 is obtained through steps similar to the steps of FIGS. 5 and 6 in the first embodiment.

The manufacturing method according to the above-described embodiments may be applied also to the MTJ element including a shift cancelling layer on the reference layer 104. Although MTJ elements having various types of structures are present, the manufacturing methods according to the embodiments may be applied generally to a method of manufacturing an MTJ element including implanting an element into a magnetic layer to reduce the influence of the damage of the magnetic layer caused by the RIE process.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetoresistive element comprising:
    a lower electrode;
    a stacked body provided on the lower electrode and comprising a first magnetic layer, a tunnel barrier layer and a second magnetic layer, wherein the tunnel barrier layer is provided on the first magnetic layer, the second magnetic layer is provided on the tunnel barrier layer, the first magnetic layer comprises a first region and a second region provided outside the first region to surround the first region, and the second region comprises an element included in the first region and another element different from the element;
    a hard mask layer provided on the stacked body;
    a cap layer provided on the hard mask layer; and
    an upper electrode penetrating the cap layer and contacting the hard mask layer.

2. The magnetoresistive element according to claim 1, wherein the cap layer comprises the another element.

3. The magnetoresistive element according to claim 1, wherein the first magnetic layer is a storage layer, and the second region of the first magnetic layer is demagnetized.

4. The magnetoresistive element according to claim 1, wherein the first magnetic layer is a storage layer, the second magnetic layer is a reference layer, and widths of the storage layer and the tunnel barrier layer are greater than a width of the reference layer.

5. The magnetoresistive element according to claim 1, wherein the another element is at least one of As, Ge, Ga, Sb, In, N, Ar, He, F, Cl, Br, I, O, Si, B, C, Zr, Tb and Ti.

6. The magnetoresistive element according to claim 1, wherein the first magnetic layer is a reference layer, and the second magnetic layer is a storage layer.

7. The magnetoresistive element according to claim 1, wherein the cap layer comprises silicon nitride.

* * * * *